United States Patent [19]

Sasaki et al.

[11] Patent Number: 5,785,068
[45] Date of Patent: Jul. 28, 1998

[54] SUBSTRATE SPIN CLEANING APPARATUS

[75] Inventors: Tadashi Sasaki; Masami Ohtani, both of Kyoto, Japan

[73] Assignee: Dainippon Screen Mfg. Co., Ltd., Japan

[21] Appl. No.: 646,131

[22] Filed: May 17, 1996

[30] Foreign Application Priority Data

May 11, 1995 [JP] Japan .................. 7-138668

[51] Int. Cl.$^6$ ..................................... B08B 3/02
[52] U.S. Cl. .......................... 134/144; 134/148; 134/181; 134/902; 239/265
[58] Field of Search .................. 134/902, 172, 134/153, 189, 144, 148, 147, 181; 235/264, 265; 118/321

[56] References Cited

U.S. PATENT DOCUMENTS

| 4,564,280 | 1/1986 | Fukuda | 134/902 |
|---|---|---|---|
| 4,728,041 | 3/1988 | Draxler et al. | 239/264 |
| 5,032,217 | 7/1991 | Tanaka | 134/153 |
| 5,259,407 | 11/1993 | Tuchida et al. | 134/902 |
| 5,608,943 | 3/1997 | Konishi et al. | 134/902 |

FOREIGN PATENT DOCUMENTS

| 2458363 | 2/1991 | France | 118/321 |
|---|---|---|---|
| 2522885 | 12/1976 | Germany | 239/264 |
| 91905 | 11/1994 | Germany | 134/201 |
| 59-88828 | 5/1984 | Japan | 134/198 |
| 61-296724 | 12/1986 | Japan | 134/902 |
| 62-89134 | 6/1987 | Japan . | |
| 62-188323 | 8/1987 | Japan | 134/902 |
| 63-266831 | 11/1988 | Japan | 134/1 |
| 1105376 | 4/1989 | Japan . | |
| 2-90523 | 3/1990 | Japan | 134/144 |
| 3-286530 | 12/1991 | Japan | 134/902 |
| 4-44227 | 2/1992 | Japan | 134/902 |
| 4-287922 | 10/1992 | Japan | 134/153 |
| 4-336430 | 11/1992 | Japan | 134/902 |
| 5-326481 | 12/1993 | Japan | 134/902 |
| 446487 | 4/1936 | United Kingdom | 239/264 |

Primary Examiner—Frankie L. Stinson
Attorney, Agent, or Firm—Ostrolenk, Faber, Gerb & Soffen, LLP

[57] ABSTRACT

A substrate spin cleaning apparatus includes a nozzle attached through a first and second support brackets to support shaft that is rotatable about a vertical axis. The nozzle delivers a cleaning liquid to the surface of a spinning substrate in a pin-point mode and under high pressure, while moving a liquid application point on the substrate surface between the substrate spin center and peripheral edge of the substrate. The first support bracket defines an arcuate slot extending within a plane including the spin center and a tip of the nozzle and along an imaginary circle about the spin center. The nozzle is attached to the second support bracket connected to the first support bracket which in turn is through the arcuate slot, to deliver the cleaning liquid to the spin center. The application point is movable through the spin center regardless of the inclination angle of the nozzle relative to the substrate surface. The nozzle inclination angle relative to the substrate surface is readily variable in accordance with the thickness or type of layer formed on the substrate surface, or the type of contaminant to be removed therefrom.

20 Claims, 4 Drawing Sheets

5,785,068

SUBSTRATE SPIN CLEANING APPARATUS

BACKGROUND OF THE INVENTION

(1) Field of the Invention

The present invention relates to substrate spin cleaning apparatus for cleaning semiconductor wafers, glass substrates for photomasks, glass substrates for liquid crystal displays, substrates for optical disks and the like. More particularly, the invention relates to a substrate spin cleaning apparatus having a substrate supporting device for supporting a substrate and spinning the substrate about a vertical axis, a nozzle for delivering a cleaning liquid to a substrate surface in a pinpoint mode and under high pressure, and a nozzle moving device for moving the nozzle to move a liquid application point on the substrate surface between a spin center and a peripheral edge of the substrate.

(2) Description of the Related Art

A conventional substrate spin cleaning apparatus is disclosed in Japanese Patent Publication (Unexamined) No. 1-105376, for example. This apparatus includes a high pressure jet nozzle for jetting out a cleaning liquid at an angle to the surface of a substrate (which is called a disk in the above publication). The cleaning liquid is supplied under high pressure to the substrate surface while the substrate is spun about a vertical axis, to remove fine particles of dust from the substrate surface.

In this prior art construction, however, the high pressure jet nozzle is at a fixed angle to the substrate surface. This nozzle angle cannot be varied in accordance with the thickness or type of layer formed on the substrate surface, or the type of contaminant to be removed therefrom. There is room for improvement from the viewpoint of achieving satisfactory substrate cleaning performance.

SUMMARY OF THE INVENTION

An object of the present invention is to provide a substrate spin cleaning apparatus allowing an inclination angle of a nozzle with respect to the surface of a substrate to be varied with easily in accordance with the thickness or type of layer formed on the substrate surface, or the type of contaminant to be removed therefrom.

Another object of the invention is to provide a substrate spin cleaning apparatus with an improved construction to dispense with a positional adjustment of a standby pot for receiving a cleaning liquid from a nozzle in a standby position, thereby to facilitating variations in nozzle angle.

Other objects of the invention will be apparent from the description of the preferred embodiments.

The above objects are fulfilled, according to the present invention, by a substrate spin cleaning apparatus having a substrate supporting device for supporting a substrate and spinning the substrate about a vertical axis, a nozzle for delivering a cleaning liquid to a surface of the substrate in a pinpoint mode and under high pressure, and a nozzle moving device for moving the nozzle to thereby move a liquid application point on the substrate surface between a spin center and a peripheral edge of the substrate, the apparatus comprising a nozzle holder attached to the nozzle moving device for supporting the nozzle at a variable inclination angle respect to the surface of the substrate, and an arcuate guide provided on the nozzle holder for guiding the nozzle within a plane including the spin center and a tip of the nozzle and along an imaginary circle about the spin center, while allowing the nozzle to deliver the cleaning liquid to the spin center.

According to the present invention, the inclination angle of the nozzle relative to the substrate surface is variable in accordance with the thickness or type of layer formed on the substrate surface, or the type of contaminant to be removed therefrom. Moreover, the nozzle is movable by guiding action of the arcuate guide when varying the inclination angle of the nozzle. Consequently, regardless of the inclination angle, the application point at which the cleaning liquid from the nozzle collides with the substrate surface is movable always through the spin center of the substrate surface. The spin center is never left uncleaned.

With the feature of the nozzle angle being variable relative to the substrate surface, the cleaning liquid is delivered at an optimal angle to the substrate surface in accordance with the thickness or type of layer formed on the substrate surface, or the type of contaminant to be removed therefrom, to assure that the results of cleaning are excellent. When varying the inclination angle of the nozzle, the arcuate guide continues to act so that the application point at which the cleaning liquid from the nozzle collides with the substrate surface is movable always through the spin center of the substrate surface. This feature dispenses with a troublesome readjusting operation to direct the cleaning liquid to the spin center on the substrate surface each time the inclination angle is varied. Thus, the inclination angle of the nozzle is variable with ease relative to the substrate surface.

The substrate spin cleaning apparatus according to the present invention may further comprise a standby pot disposed, in plan view, away from the substrate supported by the substrate supporting device for receiving the cleaning liquid delivered from the nozzle when the nozzle is moved to a standby position for suspending delivery cleaning liquid to the substrate, the standby pot having at least part of an inlet opening plane thereof located on a moving track of the liquid application point and level with the surface of the substrate.

With this construction, the cleaning liquid delivered from the nozzle in the standby position is received within the inlet opening plane of the standby pot regardless of variations in the inclination angle of the nozzle relative to the substrate surface.

Thus, the improved construction, in which the standby pot has at least part of the inlet opening plane thereof located on the moving track of the liquid application point and level with the surface of the substrate, allows the cleaning liquid delivered from the nozzle in the standby position to be received within the inlet opening plane of the standby pot regardless of variations in the inclination angle of the nozzle relative to the substrate surface. The position of the standby pot need not be adjusted when the inclination angle of the nozzle is varied, so that ease of varying the inclination angle is improved.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DETAILED DESCRIPTION OF THE PREFERRED EMBODIMENTS

Preferred embodiments of the present invention will be described hereinafter with reference to the drawings.

Figure 1:
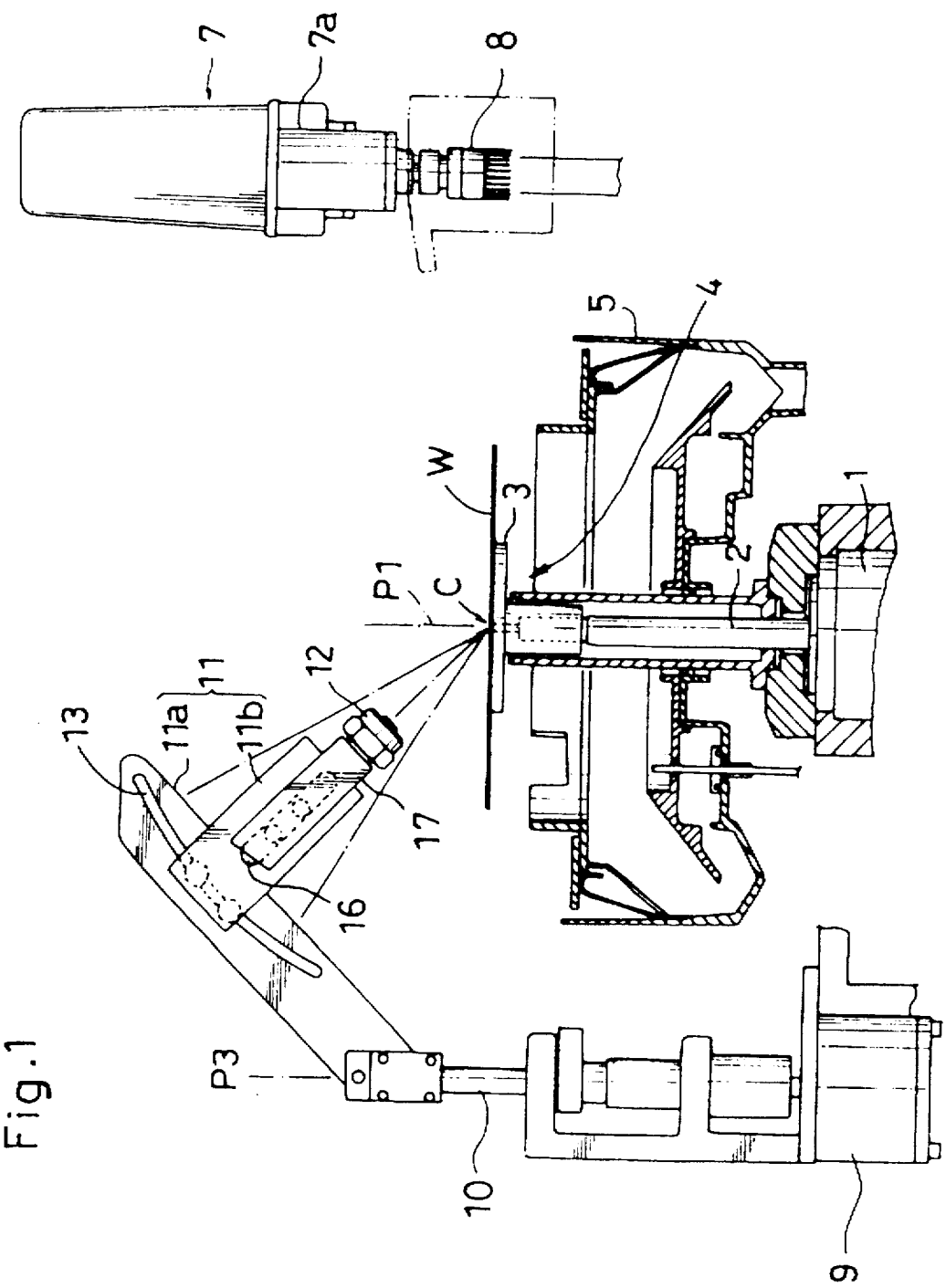
FIG. 1 is a schematic view constructed in accordance with vertical section of a substrate spin cleaning apparatus constucted in accordance with a first embodiment of the present invention.
Figure 2:
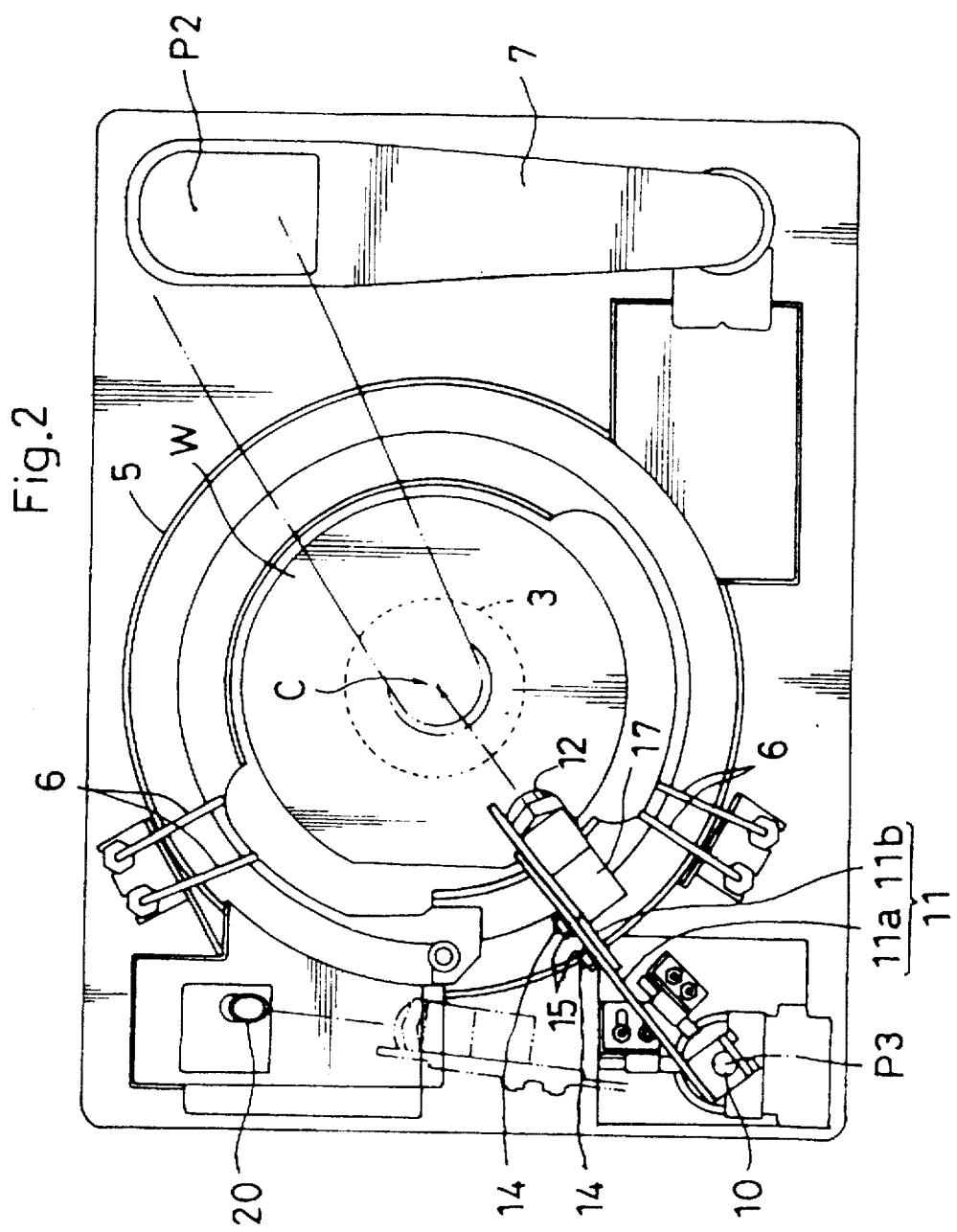
FIG. 2 is a plan view of the apparatus in the first embodiment.
Figure 3:
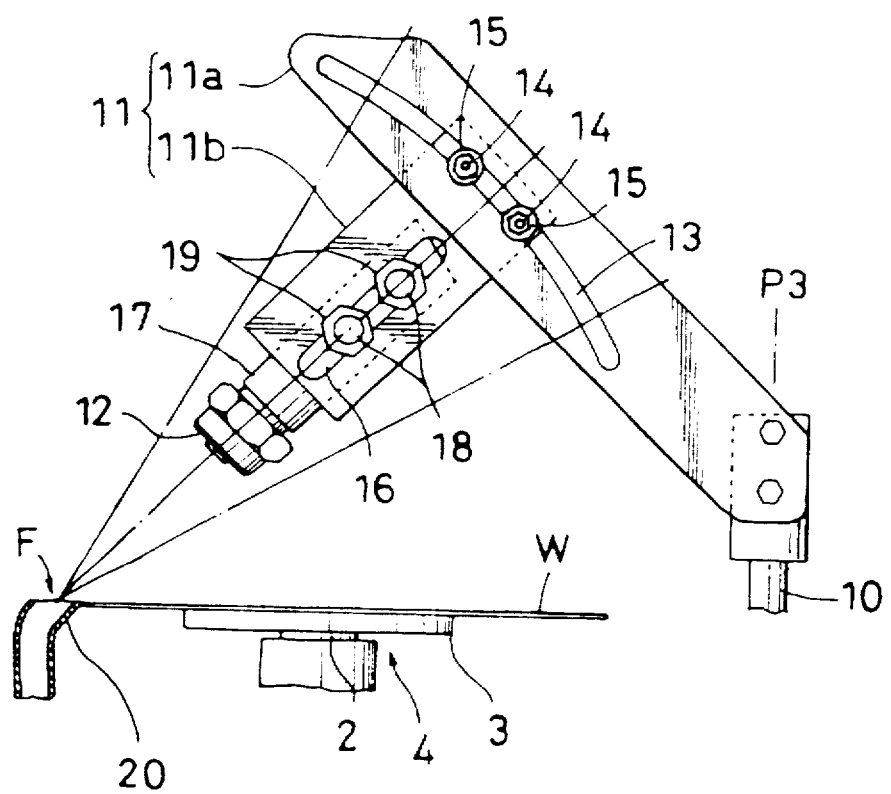
FIG. 3 is an enlarged side view of a principal portion of the apparatus in the first embodiment.

As shown in FIGS. 1 through 3, a spin cleaning apparatus according to a first embodiment of this invention includes an electric motor 1 for rotating a rotary shaft 2 about a first vertical axis P1. A turntable 3 is attached to an upper end of the rotary shaft 2 to be rotatable therewith, for supporting a substrate or wafer W by vacuum suction. These components constitute a substrate supporting device 4 for supporting wafer W and spinning it about the first vertical axis P1.

In this first embodiment, the substrate supporting device 4 includes the turntable 3 of the suction-supporting type which, however, is not limitative. For example, the substrate supporting device 4 may include a plurality of substrate supporting elements arranged on the turntable 3 for supporting wafer W at peripheries thereof, with positioning pins mounted on the upper ends of the substrate supporting elements for determining a horizontal position of wafer W. In this case, wafer W is supported for spinning movement in a position spaced from the upper surface of the turntable 3.

The substrate supporting device 4 and wafer W thereby supported are surrounded by a cup 5 vertically movable by a lift mechanism (not shown). Low pressure nozzles 6 are arranged outwardly and circumferentially of the cup 5 for delivering a cleaning liquid such as deionized water under low pressure toward the center of wafer W.

An angle-shaped support arm 7 is disposed outside the cup 5 to be pivotable about a second vertical axis P2 by an electric motor (not shown). The support arm 7 includes a forward arm portion 7a having a cleaning device 8 attached to a lower end thereof for cleaning the surface of wafer W.

Further, a support shaft 10 is disposed outside the cup 5 and opposed to the support arm 7 across the substrate supporting device 4. The support shaft 10 is rotatable about a third vertical axis P3 by an electric motor 9. The support shaft 10 supports a nozzle holder 11 including a first and a second support brackets 11a and 11b. The second support bracket 11b supports a nozzle 12 for jetting out a cleaning liquid to the surface of wafer W in a pinpoint mode and under high pressure (at least 30 kg/cm$^2$).

The nozzle 12 delivers the cleaning liquid to the spin center C of the substrate surface through which the first axis P1 extends (FIG. 2). In accordance with this function, the first support bracket 11a defines an arcuate slot 13 present in a plane including the spin center C and the tip of the nozzle 12. This arcuate slot 13 extends through a predetermined range about the spin center C. The second support bracket 11b has a pair of threaded pins 14 projecting therefrom into the arcuate slot 13, with nuts 15 screwed to the respective pins 14.

The second support bracket 11b defines a linear slot 16 extending toward the spin center C. A nozzle body 17 to which the nozzle 12 is attached has a pair of threaded pins 18 projecting therefrom into the linear slot 16, with nuts 19 screwed to the respective pins 18. Though not shown in the drawings, a high pressure hose connected to the nozzle 12 extends from the nozzle body 17 toward the support shaft 10.

With the above construction, an inclination angle of the nozzle 12 is variable about the spin center C of wafer W, while delivering the cleaning liquid from the nozzle 12 to the spin center C, by loosening the nuts 15, moving the threaded pins 14 along the arcuate slot 13, and tightening and fixing the nuts 15 in desired positions. Regardless of variations in the inclination angle, the cleaning liquid jetting out of the nozzle 12 is reliably supplied to the spin center C of wafer W when the nozzle 12 is moved horizontally. By operating the electric motor 9 to rotate the support shaft 10, an application point at which the cleaning liquid delivered from the nozzle 12 collides with the wafer surface is moved from the spin center C to a peripheral edge of wafer W. With the nozzle 12 adjusted to an optimal inclination angle in accordance with the thickness or type of layer formed on the wafer surface, or the type of contaminant to be removed therefrom, the cleaning liquid supplied under high pressure, in cooperation with the spin of wafer W, effectively cleans the entire wafer surface.

Further, by loosening the nuts 19 and moving the threaded pins 18 along the linear slot 16, a distance from the tip of nozzle 12 to the wafer surface may be adjusted in accordance with the thickness or type of layer formed on the wafer surface, or the type of contaminant to be removed therefrom.

The apparatus further includes a standby pot 20 (FIGS. 2 and 3) disposed, in plan view, away from the wafer W supported by the substrate supporting device 4. The standby pot 20 receives the cleaning liquid constantly delivered from the nozzle 12 when the nozzle 12 is moved to a standby position for suspending application of the cleaning liquid to the wafer surface. This construction is effective to prevent bacteria and the like from breeding in pipes extending from a cleaning liquid source, which could otherwise result in particles to contaminate the wafer surface.

The standby pot 20 has an inlet opening plane F (FIG. 3) located on a moving track of the application point of the cleaning liquid delivered from the nozzle 12, and level with the surface of wafer W. Thus, the standby pot 20 receives the cleaning liquid delivered from the nozzle 12 in the standby position regardless of variations in the inclination angle of the nozzle 12.

Figure 4:
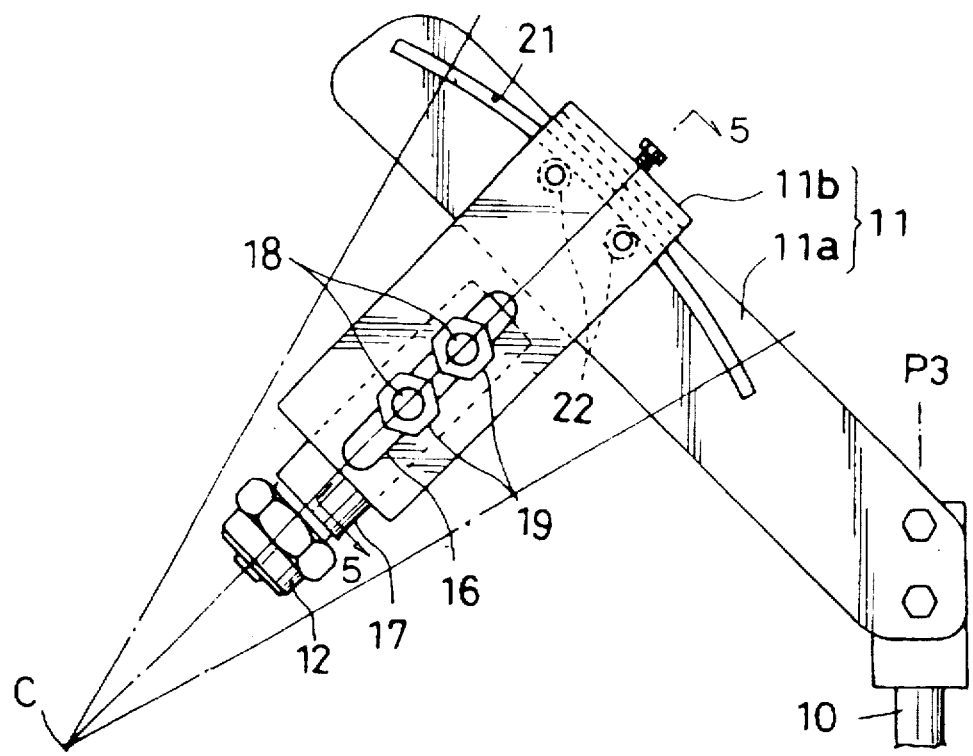
FIG. 4 is an enlarged side view of a principal portion of a second embodiment of the invention.
Figure 5:
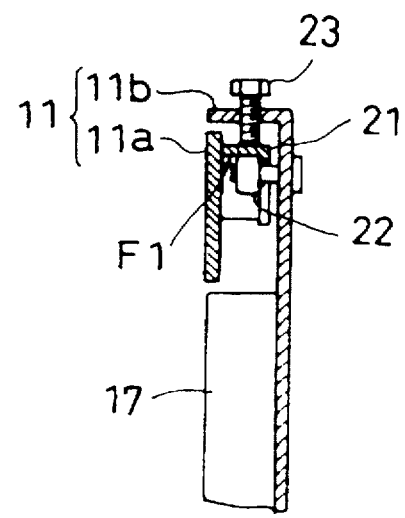
FIG. 5 is a section taken on line 5—5 of FIG. 4.

FIGS. 4 and 5 show a second embodiment, in which the first support bracket 11a has a guide element 21 formed integral therewith. The guide element 21 defines an arcuate guide surface F1 presenting a curved surface extending along an arc described in a plane including the spin center C and the tip of nozzle 12 and extending through a predetermined range about the spin center C. This construction also allows the nozzle 12 to deliver the cleaning liquid to the spin center C of the wafer surface through which the first axis P1 extends. The second support bracket 11b has a pair of guide rollers 22 attached thereto and rotatable along the arcuate guide surface F1, and a clamping bolt 23 for pressing upon the surface of guide element 21 reverse to the arcuate guide surface F1. The other aspects of this embodiment are the same as in the first embodiment.

According to the second embodiment, an inclination angle of the nozzle 12 is variable about the spin center C of wafer W, while delivering the cleaning liquid from the nozzle 12 to the spin center C, by loosening the clamping bolt 23 and allowing the guide rollers 22 to roll along the arcuate guide surface F1.

The arcuate slot 13 in the first embodiment and the arcuate guide surface F1 in the second embodiment correspond to the arcuate guide.

In the first and second embodiments, the plane including the spin center C and the tip of nozzle 12 extends vertically.

This plane may be inclined about an imaginary line extending between the spin center C and the tip of nozzle 12.

In the foregoing embodiments, the electric motor 9 is operated to rotate the support shaft 10 about the third vertical axis P3 to move the application point, at which the cleaning liquid delivered from the nozzle 12 collides with the wafer surface, from the spin center C to a peripheral edge of wafer W. Alternatively, the support shaft 10 may be driven linearly by an air cylinder or the like. These constructions constitute the nozzle moving device.

In the foregoing embodiments, the cleaning liquid is delivered intermittently from the nozzle 12 with opposite pivotal movements of the nozzle holder 11 about the axis P3, whereby the liquid application point on the wafer surface is movable only in one direction from the spin center C to a peripheral edge of wafer W. Alternatively, the cleaning liquid may be delivered continuously from the nozzle 12 with opposite pivotal movements of the nozzle holder 11 about the axis P3, whereby the liquid application point on the wafer surface is movable also from a peripheral edge to the spin center C of wafer W.

Furthermore, the cleaning liquid may be delivered continuously from the nozzle 12 moved such that the liquid application point on the wafer surface describes a locus from a peripheral edge past the spin center C and straight out at a different peripheral edge of wafer W.

In the foregoing embodiments, the entire inlet opening plane F of the standby pot 20 is a horizontal plane level with the wafer surface. The inlet opening plane F may be inclined instead. It is in accordance with the present invention as long as at least part of the inlet opening plane F, preferably a center region thereof, is located on the moving track of the application point of the cleaning liquid delivered from the nozzle 12, and level with the surface of wafer W.

The present invention is applicable also to a substrate spin cleaning apparatus for cleaning square substrates, as distinct from circular substrates or wafers as in the foregoing embodiments.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate spin cleaning apparatus comprising: a substrate supporting device supporting a substrate and spinning the substrate about an axis, a nozzle delivering a cleaning liquid to a surface of the substrate in a pinpoint mode, a nozzle moving device moving the nozzle to move a liquid application point on the substrate surface between a spin center and a peripheral edge of the substrate;
 a nozzle holder attached to said nozzle moving device and supporting said nozzle at a variable inclination angle with respect to said surface of said substrate; and
 an arcuate guide provided on said nozzle holder and guiding said nozzle within a plane including said spin center and a tip of said nozzle and along an imaginary circle about said spin center, and allowing said nozzle to deliver the cleaning liquid to said spin center.

2. A substrate spin cleaning apparatus as defined in claim 1, further comprising a standby pot disposed, in plan view, away from said substrate supported by said substrate supporting device for receiving the cleaning liquid delivered from said nozzle when said nozzle is moved to a standby position for suspending delivery of said cleaning liquid supply to said substrate, said standby pot having at least part of an inlet opening plane thereof located on a moving track of said liquid application point and level with said surface of said substrate.

3. A substrate spin cleaning apparatus as defined in claim 2, wherein said nozzle holder includes a first support bracket attached to a support shaft included in the nozzle moving device and a second support bracket supporting said nozzle, said arcuate guide comprising an arcuate slot formed in said first support bracket and extending in said plane including said spin center and said tip of said nozzle and through a predetermined range about said spin center, for guiding said nozzle in a state to deliver the cleaning liquid to said spin center.

4. A substrate spin cleaning apparatus as defined in claim 3, wherein said support shaft is rotatable about a vertical axis.

5. A substrate spin cleaning apparatus as defined in claim 4, wherein said second support bracket defines a linear slot extending toward said spin center, said nozzle being attached to a nozzle body movable along said linear slot and fixable at a selected position therein, thereby to vary a distance between said tip of said nozzle and said spin center.

6. A substrate spin cleaning apparatus as defined in claim 2, wherein said nozzle holder includes a first support bracket attached to a support shaft included in the nozzle moving device, and a second support bracket for supporting said nozzle, said arcuate guide comprising a guide element formed integral with said first support bracket and defining an arcuate guide surface presenting a curved surface extending along an arc described in said plane including said spin center and said tip of said nozzle and through a predetermined range about said spin center, for guiding said nozzle in a state to deliver the cleaning liquid to said spin center.

7. A substrate spin cleaning apparatus as defined in claim 6, wherein said support shaft is rotatable about a vertical axis.

8. A substrate spin cleaning apparatus as defined in claim 7, wherein said second support bracket defines a linear slot extending toward said spin center, said nozzle being attached to a nozzle body movable along said linear slot and fixable at a selected position therein, thereby to vary a distance between said tip of said nozzle and said spin center.

9. A substrate spin cleaning apparatus as defined in claim 7, wherein said second support bracket includes a pair of guide rollers rotatable along said arcuate guide surface, and a clamping bolt for pressing upon a surface of said guide element reverse to said arcuate guide surface to fix said second support bracket to said first support bracket.

10. A substrate spin cleaning apparatus as defined in claim 9, wherein said second support bracket defines a linear slot extending toward said spin center, said nozzle being attached to a nozzle body movable along said linear slot and fixable at a selected position therein, thereby to vary a distance between said tip of said nozzle and said spin center.

11. A substrate spin cleaning apparatus as defined in claim 1, wherein said nozzle holder includes a first support bracket attached to a support shaft included in the nozzle moving device and a second support bracket supporting said nozzle, said arcuate guide comprising an arcuate slot formed in said first support bracket and extending in said plane including said spin center and said tip of said nozzle and through a predetermined range about said spin center, for guiding said nozzle in a state to deliver the cleaning liquid to said spin center.

12. A substrate spin cleaning apparatus as defined in claim 11, wherein said support shaft is rotatable about a vertical axis.

13. A substrate spin cleaning apparatus as defined in claim 11, wherein said second support bracket defines a linear slot extending toward said spin center, said nozzle being attached to a nozzle body movable along said liner slot and fixable to a selected position therein, thereby to vary a distance between said tip of said nozzle and said spin center.

14. A substrate spin cleaning apparatus as defined in claim 1, wherein said nozzle holder includes a first support bracket attached to a support shaft included in the nozzle moving device and a second support bracket for supporting said nozzle, said arcuate guide comprising a guide element formed integral with said first support bracket and defining an arcuate guide surface presenting a curved surface extending along an arc described in said plane including said spin center and said tip of said nozzle and through a predetermined range about said spin center, for guiding said nozzle in a state to deliver the cleaning liquid to said spin center.

15. A substrate spin cleaning apparatus as defined in claim 14, wherein said support shaft is rotatable about a vertical axis.

16. A substrate spin cleaning apparatus as defined in claim 15, wherein said second support bracket defines a linear slot extending toward said spin center, said nozzle being attached to a nozzle body movable along said linear slot and fixable at a selected position therein, thereby to vary a distance between said tip of said nozzle and said spin center.

17. A substrate spin cleaning apparatus as defined in claim 15, wherein said second support bracket includes a pair of guide rollers rotatable along said arcuate guide surface, and a clamping bolt for pressing upon a surface of said guide element reverse to said arcuate guide surface to fix said second support bracket to said first support bracket.

18. A substrate spin cleaning apparatus as defined in claim 17, wherein said second support bracket defines a linear slot extending toward said spin center, said nozzle being attached to a nozzle body movable along said linear slot and fixable at a selected position therein, thereby to vary a distance between said tip of said nozzle and said spin center.

19. A substrate spin cleaning apparatus as defined in claim 1, wherein said substrate supporting device spins the substrate about a vertical axis.

20. A substrate spin cleaning apparatus as defined in claim 1, wherein said nozzle delivers said cleaning liquid under high pressure.

* * * * *

UNITED STATES PATENT AND TRADEMARK OFFICE
CERTIFICATE OF CORRECTION

PATENT NO. : 5,785,068
DATED : July 28, 1998
INVENTOR(S) : Tadashi SASAKI

It is certified that error appears in the above-indentified patent and that said Letters Patent is hereby corrected as shown below:

On the title page, at item [22], the filing date "May 17, 1996" should read --May 7, 1996--.

Signed and Sealed this

Twenty-seventh Day of October, 1998

Attest:

BRUCE LEHMAN

Attesting Officer     Commissioner of Patents and Trademarks